(12) United States Patent
Wang et al.

(10) Patent No.: US 9,147,577 B2
(45) Date of Patent: Sep. 29, 2015

(54) FLOATING GATE FLASH CELL DEVICE AND METHOD FOR PARTIALLY ETCHING SILICON GATE TO FORM THE SAME

(71) Applicant: WaferTech, LLC, Camas, WA (US)

(72) Inventors: Yimin Wang, Camas, WA (US); Raymond Li, Vancouver, WA (US)

(73) Assignee: WAFERTECH, LLC, Camas, WA (US)

( * ) Notice: Subject to any disclaimer, the term of this patent is extended or adjusted under 35 U.S.C. 154(b) by 78 days.

(21) Appl. No.: 13/875,084

(22) Filed: May 1, 2013

(65) Prior Publication Data

US 2013/0244415 A1  Sep. 19, 2013

Related U.S. Application Data

(62) Division of application No. 13/038,180, filed on Mar. 1, 2011, now Pat. No. 8,435,856.

(51) Int. Cl.
  *H01L 21/283* (2006.01)
  *H01L 21/3213* (2006.01)
  *H01L 21/28* (2006.01)
  *H01L 29/423* (2006.01)
  *H01L 29/788* (2006.01)
  *H01L 27/115* (2006.01)

(52) U.S. Cl.
  CPC ........ *H01L 21/283* (2013.01); *H01L 21/28273* (2013.01); *H01L 21/32139* (2013.01); *H01L 27/11521* (2013.01); *H01L 29/42324* (2013.01); *H01L 29/7881* (2013.01)

(58) Field of Classification Search
  CPC ...................................................... H01L 21/283
  See application file for complete search history.

(56) References Cited

U.S. PATENT DOCUMENTS

| | | |
|---|---|---|
| 6,294,429 B1 | 9/2001 | Lam et al. |
| 6,653,188 B1 | 11/2003 | Huang et al. |
| 6,881,627 B2 | 4/2005 | Forbes et al. |
| 8,236,649 B2 | 8/2012 | Kim |
| 2002/0142543 A1 | 10/2002 | Lin et al. |
| 2005/0151185 A1 | 7/2005 | Jung |
| 2005/0227434 A1 | 10/2005 | Wu et al. |
| 2006/0286738 A1 | 12/2006 | Wei |
| 2007/0026613 A1 | 2/2007 | Ryu et al. |
| 2010/0029051 A1 | 2/2010 | Jung |

*Primary Examiner* — Alexander Ghyka
(74) *Attorney, Agent, or Firm* — Duane Morris LLP

(57) ABSTRACT

A method for forming a split gate flash cell memory device provides for establishing a floating gate region then using spacers or other hard mask materials that cover opposed edges of a gate electrode material in the gate region, to serve as hard masks during an etching operation that partially etches the gate electrode material which may be polysilicon. The gate electrode so produced serves as a floating gate electrode and includes a recessed central portion flanked by a pair of opposed upwardly extending fins which may terminate upwardly at an apex. A floating gate oxide is then formed by thermal oxidation and/or oxide deposition techniques.

19 Claims, 6 Drawing Sheets

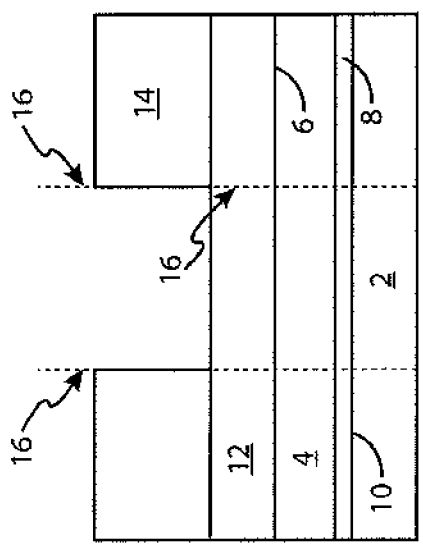
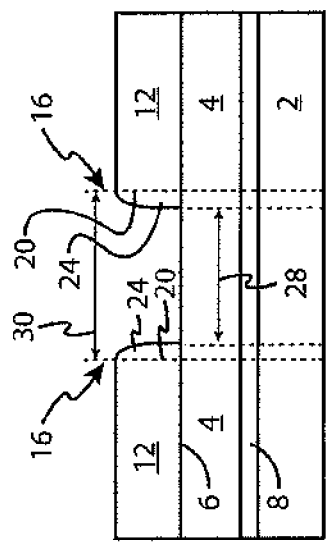
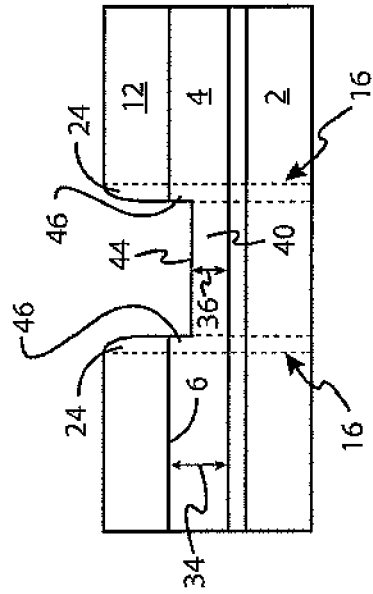
FIG. 1
FIG. 2
FIG. 3
FIG. 4

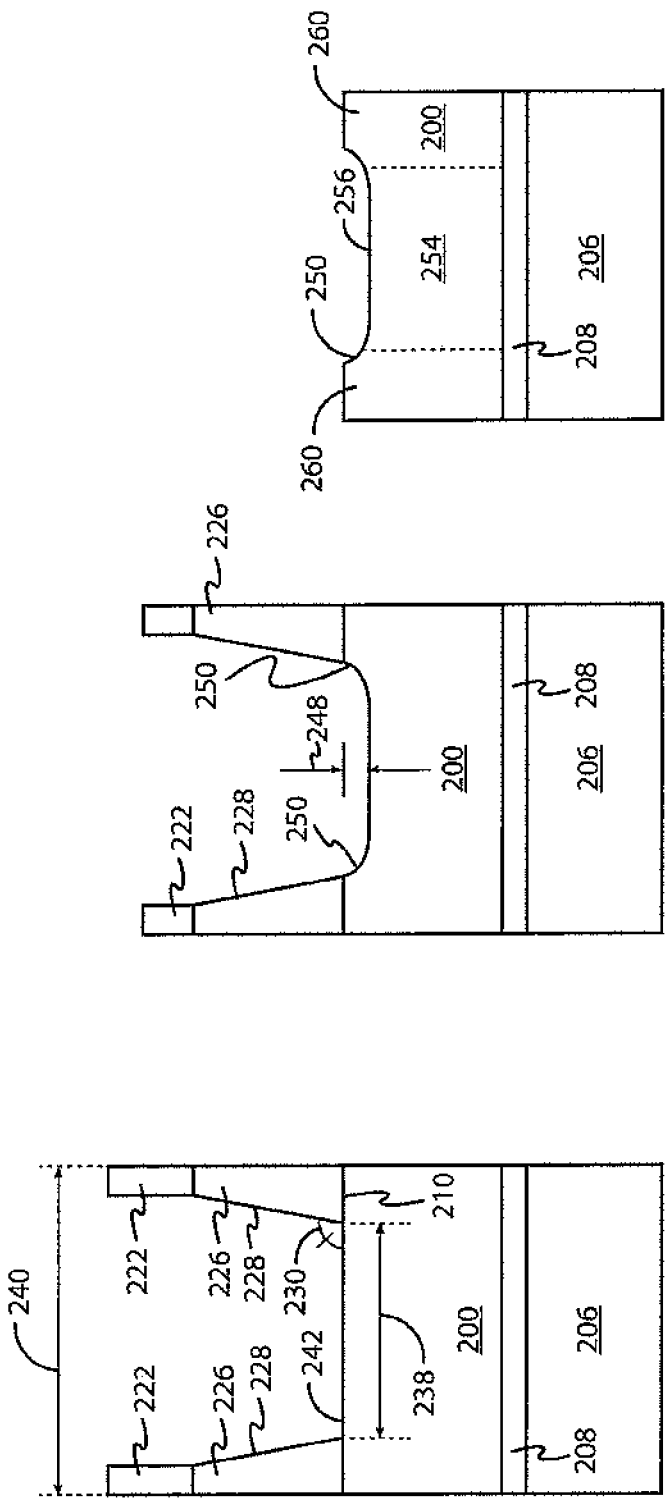

FLOATING GATE FLASH CELL DEVICE AND METHOD FOR PARTIALLY ETCHING SILICON GATE TO FORM THE SAME

RELATED APPLICATION

This a divisional application of U.S. application Ser. No. 13/038,180 filed Mar. 1, 2011, the contents of which are hereby incorporated by reference as if set forth in their entirety.

FIELD OF THE INVENTION

The present invention relates to semiconductor flash memory devices and methods for making the same.

BACKGROUND

A flash memory is a non-volatile storage device that can be electrically erased and reprogrammed. Flash memories are commonly used in memory cards, USB flash drives and solid-state drives for general storage and transfer of data between computers and other digital products. Flash memory devices typically store information in an array of memory cells made using floating gate transistors.

A floating gate transistor is a field effect transistor having a structure similar to a conventional MOSFET (metal oxide semiconductor field effect transistor). Floating gate MOSFETs are distinguished from conventional MOSFETs because the floating gate transistor includes two gates instead of one. In addition to an upper control gate, a floating gate transistor includes an additional floating gate beneath the control gate and above the transistor channel but completely electrically isolated by an insulating layer such as an oxide layer that completely surrounds the floating gate. This electrically isolated floating gate creates a floating node in DC with a number of inputs or secondary gates such as the control gate, formed above the floating gate and electrically isolated from it. These secondary gates or inputs are only capacitively connected to the floating gate. Because the floating gate is completely surrounded by highly resistive material, i.e. the insulating layer, any charge placed on the floating gate is trapped there and the floating gate remains unchanged far long periods of time until the floating gate MOSFET is erased. Unless erased, the floating gate will not discharge for many years under normal conditions. Fowler-Nordheim Tunneling or other Hot-Carrier injection mechanisms may be used to modify the amount of charge stored in the floating gate, e.g. to erase the floating gate. The erase operation is therefore critical to the operation of floating gate transistors.

The default state of an NOR ("Not Or" electronic logic gate) flash cell is logically equivalent to a binary "one" value because current flows through the channel under application of an appropriate voltage to the control gate when charge is stored in the floating gate. Such a flash cell device can be programmed or set to binary "zero" by applying an elevated voltage to the control gate.

To erase such a flash cell, i.e. resetting it to the "one" state, a large voltage of the opposite polarity is applied between the control gate and the source causing electrons to exit the floating gate through quantum tunneling. In this manner, the electrical charge is removed from the floating gate. This tunneling necessarily takes place through the inter-gate dielectric formed between the floating gate and the control gate. The inter-gate dielectric extends over the edge of the floating gate and also over a floating gate oxide formed over the floating gate and the tunneling typically takes place through the inter-gate dielectric at the edge of the floating gate. The configuration and shape of the floating gate and the inter-gate dielectric have a significant impact on tunneling and the ability to erase the flash cell. It is therefore important to provide a floating gate transistor having a floating gate electrode, floating gate oxide and inter-gate dielectric appropriately configured to promote the creation of a strong electric field that enables tunneling and allows for the flash cell device to be easily erased.

The present invention addresses these concerns.

BRIEF DESCRIPTION OF THE DRAWING

The present invention is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

FIGS. 1-8 are cross-sectional views showing stages in a sequence of processing operations used to form a split gate flash cell according to an embodiment of the invention;

FIGS. 13-18 are cross-sectional views illustrating another exemplary embodiment of a sequence of processing operations used to form a split gate flash cell according to the invention.

DETAILED DESCRIPTION

Figure 5:
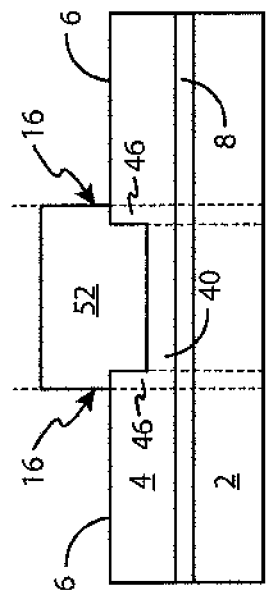

Various aspects of the invention provide for the fabrication of split gate flash cells that include floating gate transistors. A layer of gate material such as polysilicon or another suitable material is formed over a gate dielectric layer disposed on a semiconductor substrate and a nitride layer is formed over the layer of gate material. The gate region of a floating gate transistor is defined and an etching operation is carried out to remove a partial thickness of the gate material from a central portion of the gate region to produce a floating gate with a recessed central portion flanked by fins or other upward projections at the opposed edges of the floating gate. According to one aspect, the fins may be tapered and they may terminate upwardly at apices. A floating gate oxide or other floating gate dielectric is then formed over the floating gate which may have a generally concave upper surface. Further processing operations are used to optionally divide the floating gate into multiple floating gates and to form one or more control gates over the structure, thereby forming one or more corresponding floating gate transistors.

According to the various exemplary embodiments, the floating gate oxide may be formed without using the more conventional LOCOS (local oxidation of silicon) processes for forming a floating gate oxide using nitride as a masking element.

Now turning to the figures, substrate 2 may be silicon or another suitable semiconductor substrate as shown in FIG. 1. Gate material layer 4 includes top surface 6 and is formed over gate dielectric 8 which is formed on substrate surface 10.

Gate dielectric 8 may be an oxide or other suitable gate dielectric material. In one exemplary embodiment, gate material layer 4 may be polysilicon or another suitable silicon layer but in other exemplary embodiments, gate material layer 4 may be other suitable gate materials. Nitride layer 12 is formed over top surface 6 of gate material layer 4. Nitride layer 12 may be silicon nitride, silicon oxynitride, or other suitable nitride materials. Patterned photoresist layer 14 includes an opening that defines gate region 16. Conventional methods may be used to form the respective layers and to form and pattern, patterned photoresist layer 14.

Using patterned photoresist layer 14 as a mask, an etching operation is carried out to remove nitride layer 12 from gate region 16. Patterned photoresist layer 14 is then stripped to produce the structure shown in FIG. 2. Top surface 6 of gate material layer 4 is exposed in gate region 16. Etched nitride layer 12 includes exposed upper surface 18 and sidewalls 20 that bound the opening formed in nitride layer 12 and within gate region 16.

Now referring to FIG. 3, dielectric spacers 24 are formed along sidewalls 20 of nitride layer 12 in gate region 16. A central portion of top surface 6 of gate material layer 4 remains exposed but it can be seen that width 28 of the exposed portion of gate material layer 4 is less than width 30 of gate region 16 due to the presence of dielectric spacers 24. Dielectric spacers 24 may be formed by depositing a dielectric such as an oxide layer over the structure shown in FIG. 2, i.e. over upper surfaces 18 of nitride layer 12 and top surface 6 of gate material layer 4 and along sidewalls 20 and depending on the thickness of the deposited dielectric layer used, it may also fill the opening formed in nitride layer 12 within gate region 16. The dielectric layer may advantageously be an oxide layer formed using CVD, chemical vapor deposition, PVD, plasma vapor deposition, PECVD, plasma enhanced chemical vapor deposition, or other suitable deposition techniques, using known methods. In one exemplary embodiment, the oxide layer may be a TEOS (tetraethyl orthosilicate) layer formed using known deposition techniques. After the deposited dielectric layer is formed over nitride layer 12 and within the opening in gate region 16, a conventional anisotropic etching process may be used to form dielectric spacers 24 alongside sidewalls 20, as shown in FIG. 3.

Now turning to FIG. 4, an etching procedure is carried out to partially etch gate material layer 4. According to one exemplary embodiment, gate material layer 4 may be polysilicon which may be doped or undoped and a conventional anisotropic polysilicon etching process may be used. FIG. 4 shows that gate material layer 4 is partially etched, i.e. original thickness 34 is diminished to reduced thickness 36 in central portion 40 of gate material layer 4 in gate region 16. Receded upper surface 44 is recessed below top surface 6. According to one exemplary embodiment, original thickness 34 may lie within the range of 500-1200 angstroms and reduced thickness 36 may lie within a range of about 350 to 900 angstroms. Within gate region 16, gate material layer 4 includes central portion 40 flanked by upwardly extending fins 46. Fins 46 and recessed central portion 40 results when dielectric spacers 24 serve as hard masks during the etching of gate material layer 4.

An oxide deposition process operation followed by a polishing operation such as chemical mechanical polishing, CMP, is used to produce the structure now shown in FIG. 5. The oxide deposition method may be TEOS or any of the aforementioned oxide deposition techniques. The deposited oxide fills the recessed portion of gate material layer 4, i.e. the portion over central portion 40 and bounded laterally by fins 46, and the entire opening formed in gate region 16. FIG. 5 shows floating gate oxide 52 which includes the deposited oxide and also dielectric spacers 24, which are advantageously oxide spacers and indicated by dashed lines in the illustrated embodiment.

Figure 6:
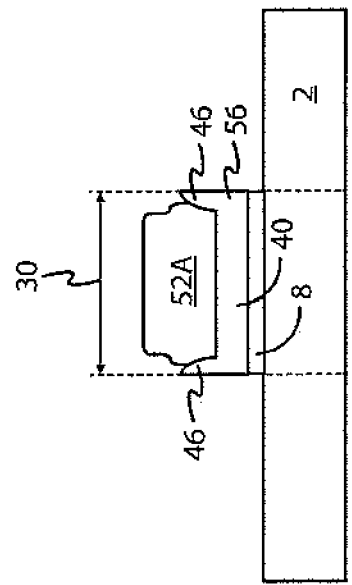

Nitride layer 12 is removed to produce the structure shown in FIG. 6 which includes floating gate oxide 52 within gate region 16 and exposed top surfaces of gate material layer 4 in regions other than gate region 16. Fins 46 and central portion 40 of gate material layer 4 are disposed in gate region 16.

Figure 7:
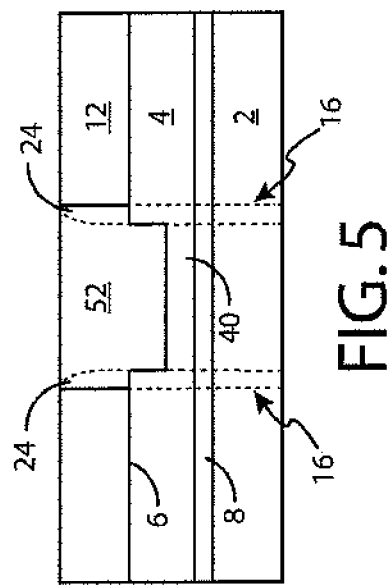

Floating gate oxide 52 is used as a hard mask and an etching procedure is carried out to remove portions of gate material layer 4 from regions other than gate region 16. This etch exposes upper surface 54 of gate dielectric 8 and produces floating gate electrode 56 which includes central portion 40 which is recessed with respect to upwardly extending fins 46 disposed at opposed lateral edges of floating gate 56 as shown in FIG. 7. Fins 46 may be generally tapered in cross-section.

Figure 8:
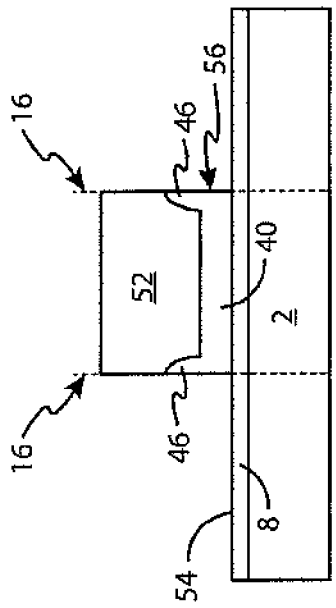

FIG. 8 shows the structure after exposed portions of gate dielectric 8 are removed from areas other than gate region 16. According to one advantageous embodiment, an isotropic, wet etching process may be used to etch gate dielectric 8 which may be an oxide, and also portions of floating gate oxide 52 that was shown in FIG. 7. Floating gate oxide 52A shown in FIG. 8 is now laterally and downwardly receded with respect to floating gate oxide 52 that was shown in FIG. 7 prior to the isotropic oxide etch. FIG. 8 shows floating gate 56 including fins 46 and central portion 40 which is recessed with respect to fins 46, and includes width 30.

According to various exemplary embodiments, floating gate 56 may be divided into two separate gates, each of which serves as a floating gate transistor. The two floating gate transistors may combine to form a split gate flash cell memory device. The sequence of processing operations for forming this exemplary embodiment is shown in FIGS. 9 and 10.

Figure 11:
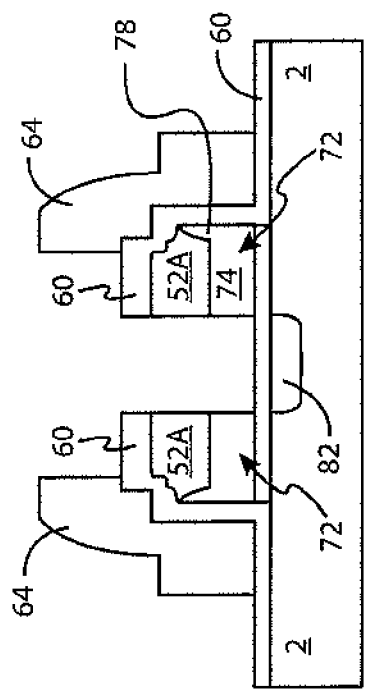
FIGS. 11-12 are cross-sectional views illustrating another exemplary embodiment of a sequence of processing operations following the processing operation illustrated in FIG. 8 to form a split gate flash cell, according to the invention.
Figure 12:
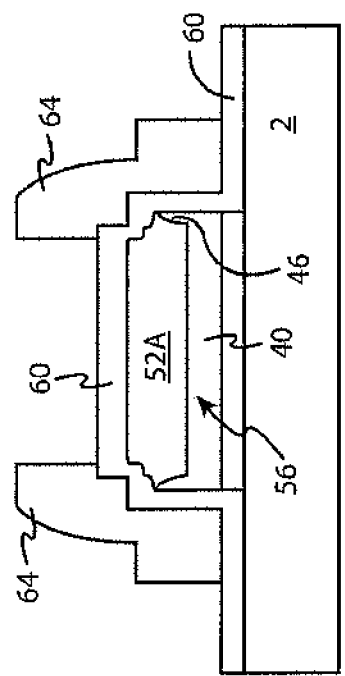

According to various other exemplary embodiments, floating gate 56 may serve as a singular floating transistor gate for a floating gate transistor. The sequence of processing operations for forming this exemplary embodiment is shown in FIGS. 11 and 12. According to this exemplary embodiment, another floating gate transistor may be simultaneously fabricated alongside the floating gate formed according to the process sequence illustrated in FIGS. 1-8, to combine to form a split gate flash cell memory device.

The floating gates may include a recessed central portion flanked by a pair of upwardly extending fins at each of the opposed edges of the floating gate or a recessed portion with an upwardly extending fin at one of the opposed edges of the floating gate.

Figure 9:
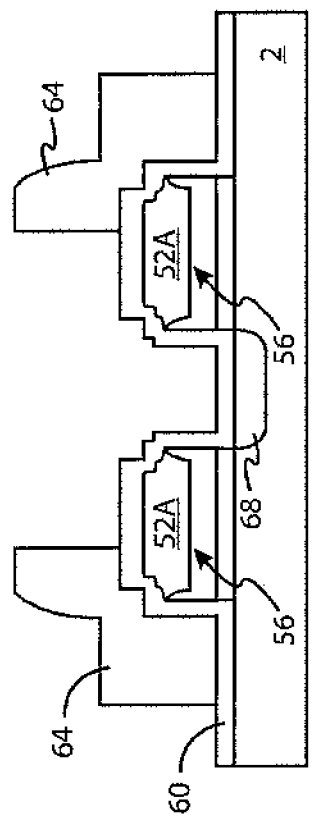
FIGS. 9-10 are cross-sectional views illustrating one exemplary embodiment of a sequence of processing operations following the processing operation illustrated in FIG. 8 to form a split gate flash cell, according to the invention.
Figure 10:
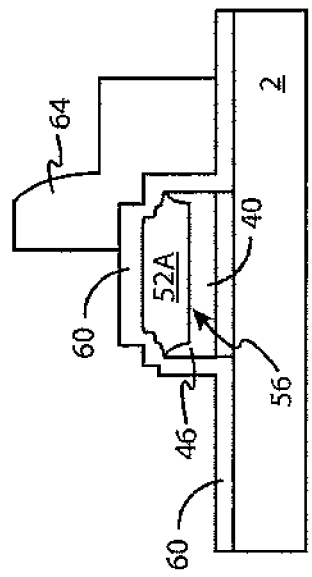

FIGS. 9 and 10 illustrate one exemplary embodiment for forming a split gate flash cell memory device using a duality of floating gates such as the one illustrated in FIG. 8. FIG. 9 shows the structure in FIG. 8 after inter-gate dielectric 60 is formed over the structure shown in FIG. 8. Inter-gate dielectric 60 may be thermally formed such as by HTO (high temperature oxidation) or other thermal oxidation or oxide deposition techniques. Control gate 64 extends partially over floating gate 56. Control gate 64 may be formed by depositing a polysilicon layer after inter-gate dielectric 60 is formed and then using conventional lithographic and etching procedures to produce control gate 64 from the deposited polysilicon layer. In other exemplary embodiments, other silicon materials or still other materials may be used for control gate 64. The structure shown in FIG. 9 may serve as a floating gate transistor.

According to one exemplary embodiment, two floating gate transistors such as the one floating gate transistor shown in FIG. 9, may be simultaneously fabricated adjacent one another to produce the split gate flash cell memory device shown in FIG. 10. FIG. 10 shows two floating gate transistors that combine to form a split gate flash cell and utilize common source 68 formed in substrate 2. Common source 68 may be formed using conventional implantation techniques with floating gates 56 in place, i.e. a self-aligned source region is formed.

According to another exemplary embodiment, such as when width 30 of floating gate 56 is sufficiently large as fabricated in FIG. 8, floating gate 56 may be separated into two separated floating gates as shown in FIGS. 11, 12. FIG. 11 shows an embodiment of the structure of FIG. 8 illustrated to include a larger width than illustrated in FIG. 8, after intergate dielectric 60 is formed over the structure and also after two control gates 64 have been formed over the opposed ends of floating gate 56. After the two control gates 64 are formed, patterning and etching operations may be used to essentially separate floating gate 56 shown in FIG. 11, into two separated floating gates 72 shown in FIG. 12 by removing a medial segment of floating gate 56 shown in FIG. 11, such as by etching. Each floating gate 72 includes base portion 74 and one upwardly extending fin 78. Common source 82 is formed in substrate 2 using ion implantation techniques and can be a self-aligned common source region 82.

Figure 13:
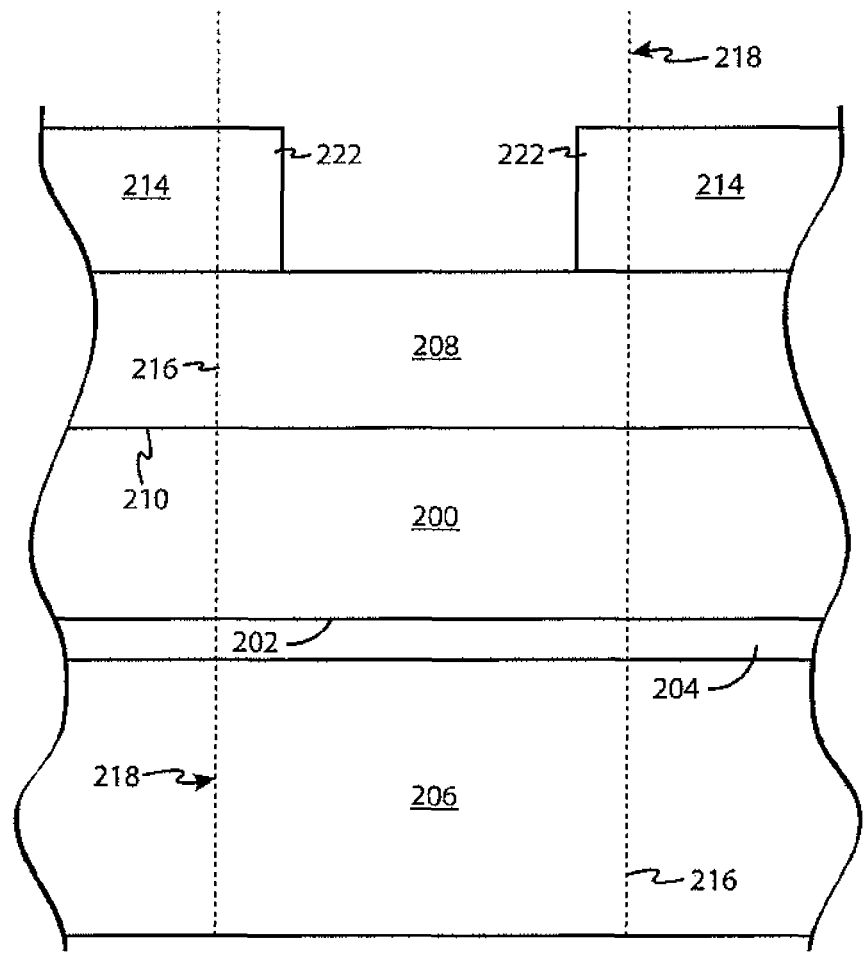

FIGS. 13-18 show a sequence of processing operations used to form a split gate flash device according to another exemplary embodiment. FIG. 13 shows polysilicon layer 200 formed on top surface 202 of gate dielectric 204 formed on substrate 206. According to other exemplary embodiments, polysilicon layer 200 may be formed of various other, suitable gate materials but will be referred to hereinafter simply as polysilicon layer 200. Polysilicon layer 200 may include a thickness ranging from about 500 to 1500 angstroms in various exemplary embodiments. Nitride layer 208 is formed over top surface 210 of polysilicon layer 200. Nitride layer 208 may be silicon nitride according to one advantageous embodiment, but nitride layer 208 may be silicon oxynitride or other suitable nitride materials according to other exemplary embodiments. Nitride layer 208 may include a thickness ranging from about 1000-2500 angstroms according to one exemplary embodiment but other thicknesses may be used in other exemplary embodiments. Patterned photoresist layer 214 is formed over nitride layer 208. Dashed lines 216 designate gate region 218 and it can be seen that patterned photoresist layer 214 includes edges 222 that extend into gate region 218, leaving a central portion of gate region 218 not covered by photoresist edges 222. Various suitable conventional materials and techniques may be used to form the structure shown in FIG. 13.

A tapered nitride etch process is performed on the structure shown in FIG. 13, to produce the structure shown in FIG. 14. For clarity, only the gate region (218 in FIG. 13) is illustrated in FIGS. 14-18. The tapered etch removes nitride layer 208 from the central portion of gate region 218 and leaves nitride edges 226 at opposed ends of gate region 218. Nitride edges 226 include angled sidewalls 228. Various dry etching procedures such as RIE, reactive ion etching, procedures may be used to etch nitride layer 208 to produce angled sidewalls 228. Angled sidewalls 228 form angle 230 with top surface 210 of polysilicon layer 200. According to one exemplary embodiment, angle 230 may be about 70°, but according to other exemplary embodiments, angle 230 may range from about 50° to 90°, but will advantageously be less than 90° according to the embodiment in which sidewalls 228 are angled. Width 238 of exposed portion 242 of top surface 210 is less than width 240 of gate region 218.

With nitride edges 226 in place with angled sidewalls 228, a polysilicon etching operation may be carried out to partially etch polysilicon layer 200, to form the structure shown in FIG. 15. Depth 248 of polysilicon layer 200 is removed. Depth 248 may range from about 200-400 angstroms in various exemplary embodiments, but different depths may be utilized in other exemplary embodiments and may depend on the original thickness of polysilicon layer 200. Various dry etching procedures such as RIE, reactive ion etching, procedures may be used to partially etch polysilicon layer 200. In the illustrated embodiment, the upper surface of polysilicon layer 200 is essentially concave and includes rounded corners 250 as a result of the angled sidewalls 228 of nitride edges 226.

The remnants of photoresist layer 214 including edges 222, and nitride layer 208 including nitride edges 226 may be removed to form the structure in the floating gate region as illustrated in FIG. 16. Central portion 254 of polysilicon layer 200 includes recessed top surface 256 and is bounded by rounded corners 250 and a duality of upwardly extending projections 260 within the gate region.

Conventional patterning and etching techniques are then utilized to remove portions of polysilicon layer 200 outside gate region 218. In some exemplary embodiments, gate region 218 is defined such that outer edge portions of polysilicon large 200 are also removed from the gate region to produce floating gate 262 shown in FIG. 17 in which portions of upwardly extending projections 260 shown in FIG. 16 have also been removed. Well-known dry etching techniques such as RIE may be used. Floating gate 262 includes central portion 254 flanked by upwardly extending lateral edges 266. Lateral edges 266 may be tapered in nature and may advantageously come to an apex such as tip 270 as shown in the illustrated embodiment of FIG. 17, but lateral edges 266 may take on other configurations in other exemplary embodiments.

Figure 18:
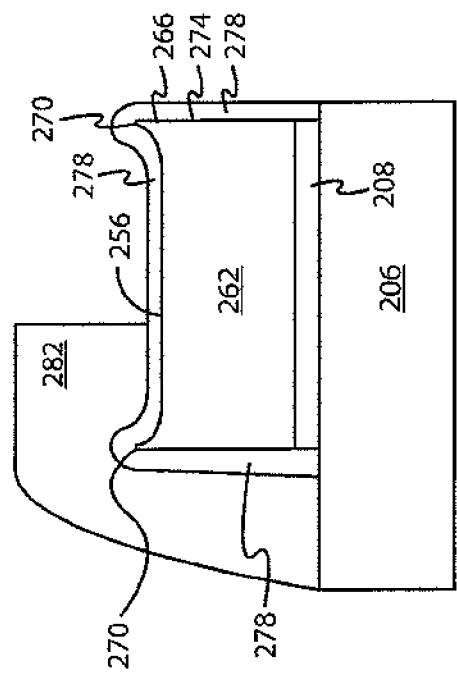
Figure 17:
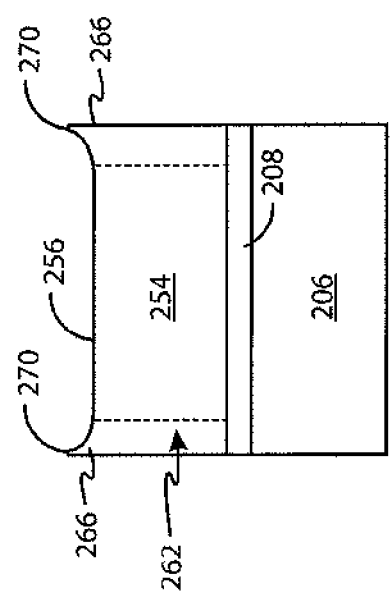

An oxide layer or layers is then formed on the structure shown in FIG. 17 to produce the floating gate transistor structure shown in FIG. 18. The structure shown in FIG. 17 may undergo a sidewall oxidation that oxidizes floating gate 262 to produce an oxide layer on exposed surfaces. The oxide may include a thickness ranging from about 10 angstroms to about 50 angstroms. The oxide layer is formed along sidewalls 274, recessed top surface 256 and lateral edges 266. According to one advantageous embodiment in which lateral edges 266 include pointed tip 270, the oxidation will partially consume the silicon of lateral edges 266 and produce an even more pointed tip 270 as the apex of lateral edges 266. After the sidewall oxidation is carried out, a further oxide layer is formed such as by using HTO, high temperature oxidation, to form composite oxide layer 278. Control gate 282 may then be formed over floating gate 262 including over composite oxide layer 278 to form a floating gate transistor. Control gate 282 may be formed of polysilicon or other suitable gate materials and may be formed and patterned using conventional methods.

It should be understood that, similar to the processing operations shown in the sequences of FIGS. 9-10 and in the sequences of FIGS. 11-12, floating gate 262 may be separated into two floating gates by removing a medial portion by etching or it may be formed in tandem with an adjacent floating gate formed according to the same methods with a common source formed between the structures.

One aspect of the invention provides a method for forming a floating gate transistor. The method comprises forming a polysilicon layer over a gate dielectric layer disposed on a semiconductor substrate, defining a gate region for a floating gate transistor, and etching to remove a partial thickness of the polysilicon layer in a central section of the gate region. The method further includes removing the polysilicon layer from areas other than the gate region, thereby producing a floating gate from the polysilicon layer. The floating gate includes upwardly extending fins disposed at opposed lateral edges and a recessed central portion interposed therebetween. The method also includes forming a gate oxide over the floating gate, including over the recessed central portion and the fins, and forming a control gate at least partially over the floating gate oxide.

One aspect of the invention provides a method for forming a floating gate transistor comprising: forming a silicon layer over a gate dielectric layer disposed on a substrate; forming a nitride layer over the silicon layer; removing the nitride layer from a floating gate region thereby forming a void bounded laterally by opposed sidewalls of the nitride layer; and forming spacers of a spacer oxide material along the opposed sidewalls. The method further comprises: partially etching a central section of the silicon layer not covered by the spacers in the floating gate region, thereby forming a recessed central portion of the silicon in said floating gate region; depositing a further oxide material over the recessed portion within said floating gate region; removing the nitride layer; and removing the silicon layer from areas other than the floating gate region, thereby forming a floating gate.

According to another aspect, a method for forming a floating gate transistor comprises: forming a polysilicon layer over a gate dielectric layer formed over a semiconductor substrate; forming a nitride layer over the polysilicon layer; defining a floating gate region; forming a patterned photoresist layer over the nitride layer, the patterned photoresist layer having photoresist edges extending into the floating gate region. The method further comprises: etching the nitride layer not covered by the photoresist edges in the floating gate region, to produce opposed nitride edges of the nitride layer within the floating gate region; using the opposed nitride edges as hard masks and etching a partial depth of the polysilicon layer in a central section of the floating gate region; removing the nitride layer; removing portions of the polysilicon layer from regions other than the floating gate region thereby forming a floating gate; and forming an oxide on said floating gate.

According to another aspect, a method for forming a semiconductor device is provided. The method comprises: forming a polysilicon layer over a gate dielectric layer disposed on a semiconductor substrate; defining a gate region for a floating gate transistor; etching to shape the polysilicon layer to produce a floating gate including upwardly extending fins disposed at opposed lateral edges in the gate region and a recessed central portion interposed therebetween.

According to another aspect, a method for forming a floating gate transistor is provided. The method comprises: forming a silicon layer over a gate dielectric layer disposed on a substrate; defining a gate region for a floating gate transistor; removing a partial thickness of the silicon layer in a central section of the gate region; removing the silicon layer from areas other than the gate region thereby producing a floating gate from the silicon layer in the gate region, the floating gate including upwardly extending fins disposed at opposed lateral edges and a recessed central portion interposed therebetween; and forming a floating gate oxide over the floating gate including over the recessed central portion and the upwardly extending fins.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for forming a floating gate transistor, comprising:
   forming a polysilicon layer over a gate dielectric layer disposed on a semiconductor substrate;
   defining a gate region for a floating gate transistor;
   disposing a layer over said polysilicon layer that includes opposed edge features that extend into said gate region;
   etching to remove a partial thickness of said polysilicon layer in a central section of said gate region using said edge features;
   removing said polysilicon layer from areas other than said gate region thereby producing a floating gate from said polysilicon layer in said gate region, said floating gate including upwardly extending fins disposed at opposed lateral edges and a recessed central portion interposed therebetween;
   forming a floating gate oxide over said floating gate including over said recessed central portion and said fins; and
   forming a control gate at least partially over said floating gate oxide.

2. The method as in claim 1, wherein said disposing a layer comprises forming a nitride layer over said polysilicon layer, wherein said etching to remove a partial thickness comprises said nitride layer covering said polysilicon layer in areas other than said gate region, and further comprising removing said nitride layer prior to said removing said polysilicon layer from areas other than said gate region.

3. The method as in claim 1, further comprising forming an inter-gate dielectric over said floating gate oxide and wherein said forming a control gate comprises forming said control gate over said inter-gate dielectric.

4. The method as in claim 1, wherein said removing said polysilicon layer from areas other than said gate region takes place before said forming a floating gate oxide.

5. The method as in claim 4, wherein said disposing a layer comprises forming a nitride layer over said polysilicon layer, wherein said opposed edge features comprise opposed nitride edges, and wherein said etching to remove a partial thickness comprises patterning said nitride layer to produce said opposed nitride edges and then using said nitride layer including said opposed nitride edges as hard masks during said etching to remove said partial thickness.

6. The method as in claim 5, wherein said opposed nitride edges have angled sidewalls and wherein said using said nitride layer including said opposed nitride edges as hard masks and said etching to remove a partial thickness produces said upwardly extending fins each having a tapered cross section.

7. The method as in claim 1, wherein said forming a floating gate oxide takes place prior to said removing said polysilicon layer from areas other than said gate region, and wherein said floating gate oxide serves as a hard mask during said removing said polysilicon layer from areas other than said gate region.

8. The method as in claim 7, wherein said disposing a layer comprises forming a nitride layer over said polysilicon layer and wherein said defining a gate region comprises etching to remove said nitride layer from said gate region thereby forming a void in said nitride layer bounded by sidewalls, and
wherein said opposed edge features comprise oxide spacers disposed along said sidewalls.

9. The method as in claim 8, wherein said forming a floating gate oxide comprises depositing an oxide within said void, filling said recessed central portion and covering said fins, said oxide combining with said oxide spacers to form said floating gate oxide.

10. A method for forming a floating gate transistor, comprising:
forming a silicon layer over a gate dielectric layer disposed on a substrate;
defining a gate region for a floating gate transistor;
forming a nitride layer over said silicon layer;
removing a partial thickness of said silicon layer in a central section of said gate region by patterning said nitride layer to produce opposed nitride edges with angled sidewalls and which extend into said gate region and then using said nitride layer including said opposed nitride edges, as hard masks during an etching operation that removes said partial thickness;
removing said silicon layer from areas other than said gate region thereby producing a floating gate from said silicon layer in said gate region, said floating gate including upwardly extending fins disposed at opposed lateral edges and a recessed central portion interposed therebetween; and
forming a floating gate oxide over said floating gate including over said recessed central portion and said upwardly extending fins.

11. The method as in claim 10, wherein said silicon layer comprises a polysilicon layer and said forming a floating gate oxide comprises a thermal oxidation process followed by an oxide deposition process.

12. The method as in claim 10, wherein said forming a floating gate oxide takes place prior to said removing said silicon layer from areas other than said gate region, and wherein said floating gate oxide serves as a hard mask during said removing said silicon layer from areas other than said gate region.

13. A method for forming a floating gate transistor, comprising:
forming a silicon layer over a gate dielectric layer disposed on a substrate;
defining a gate region for a floating gate transistor;
removing a partial thickness of said silicon layer in a central section of said gate region;
removing said silicon layer from areas other than said gate region thereby producing a floating gate from said silicon layer in said gate region, said floating gate including upwardly extending fins disposed at opposed lateral edges and a recessed central portion interposed therebetween; and
forming a floating gate oxide over said floating gate including over said recessed central portion and said upwardly extending fins,
further comprising forming a nitride layer over said silicon layer and wherein said defining a gate region comprises etching to remove said nitride layer from said gate region thereby forming a void in said nitride layer over said gate region and bounded by sidewalls, and
wherein said removing a partial thickness of said silicon layer comprises forming oxide spacers along said sidewalls and using said oxide spacers as a mask, and etching.

14. The method as in claim 13, wherein said forming a floating gate oxide comprises depositing an oxide within said void and which fills said recessed central portion and covers said fins, said oxide combining with said oxide spacers to form said floating gate oxide and further comprising forming a control gate at least partially over said floating gate oxide.

15. The method as in claim 10, further comprising:
separating said floating gate into two separated floating gates by removing a medial section of said floating gate;
forming a common source area in said substrate and between said two separated floating gates;
forming an inter-gate oxide layer over each said separated floating gate; and
forming a corresponding control gate extending at least partially over each said separated floating gate.

16. A method for forming a semiconductor device, said method comprising:
forming a silicon layer over a gate dielectric layer disposed over a semiconductor substrate;
forming a nitride layer over said silicon layer;
defining a gate region and patterning said nitride layer to produce opposed nitride edges with angled sidewalls that extend into opposed edges of said gate region; and
using said nitride layer including said opposed nitride edges, as a hard mask during an etching operation that removes a partial thickness of said silicon layer in said gate region so as to produce a silicon floating gate that includes upwardly extending fins disposed at opposed lateral edges in said gate region and a recessed central portion interposed therebetween.

17. The method as in claim 16, further comprising forming a floating gate oxide over said silicon floating gate including over said recessed central portion and said upwardly extending fins; and forming a control gate at least partially over said floating gate oxide.

18. The method as in claim 16, further comprising:
separating said silicon floating gate into two separated floating gates by removing a medial section of said silicon floating gate;
forming a common source area in said substrate and between said two separated floating gates;
forming an inter-gate oxide layer over each said separated floating gate; and
forming a corresponding control gate extending at least partially over each said separated floating gate.

19. The method as in claim 16, wherein said nitride layer covers said silicon layer in areas other than said gate region during said etching operation, and further comprising:
removing said nitride layer after said using,
forming a floating gate oxide over said silicon floating gate, and
using said floating gate oxide as a hard mask in an etching operation that removes said silicon layer from areas other than said gate region.

\* \* \* \* \*